United States Patent
Lee et al.

(10) Patent No.: US 8,530,251 B2
(45) Date of Patent: Sep. 10, 2013

(54) MANUFACTURING METHOD OF HIGH-EFFICIENCY LED

(75) Inventors: Yeeu-Chang Lee, Jhongli (TW); Ching-Huai Ni, Jhongli (TW)

(73) Assignee: Chuan-Yuan Christian University, Jhongli (TW)

( * ) Notice: Subject to any disclaimer, the term of this patent is extended or adjusted under 35 U.S.C. 154(b) by 0 days.

(21) Appl. No.: 13/366,783

(22) Filed: Feb. 6, 2012

(65) Prior Publication Data

US 2012/0208307 A1 Aug. 16, 2012

(30) Foreign Application Priority Data

Feb. 14, 2011 (TW) .............................. 100104830 A

(51) Int. Cl.
*H01L 21/00* (2006.01)
(52) U.S. Cl.
USPC .............. 438/27; 257/E21.499; 257/E21.502; 438/26; 438/28; 438/29; 438/33

(58) Field of Classification Search
USPC ................... 257/E21.499, E21.502; 438/26, 438/27, 28, 29, 33
See application file for complete search history.

(56) References Cited

U.S. PATENT DOCUMENTS

| | | | |
|---|---|---|---|
| 2007/0009968 A1* | 1/2007 | Cunningham et al. | 435/7.9 |
| 2007/0257565 A1* | 11/2007 | Urey et al. | 310/38 |
| 2008/0179611 A1* | 7/2008 | Chitnis et al. | 257/98 |
| 2011/0169030 A1* | 7/2011 | Li | 257/98 |
| 2012/0133077 A1* | 5/2012 | Mizawa et al. | 264/293 |

* cited by examiner

*Primary Examiner* — Asok K Sarkar
(74) *Attorney, Agent, or Firm* — Rabin & Berdo, P.C.

(57) ABSTRACT

A manufacturing method of a high-efficiency light-emitting diode (LED) is provided. A soft mold is used to transfer a microstructure or a nano-scale pattern thereon onto an imprinting material. The imprinting material is distributed all over an LED wafer; and the imprinting process may be performed through forward imprinting or reverse imprinting.

10 Claims, 12 Drawing Sheets

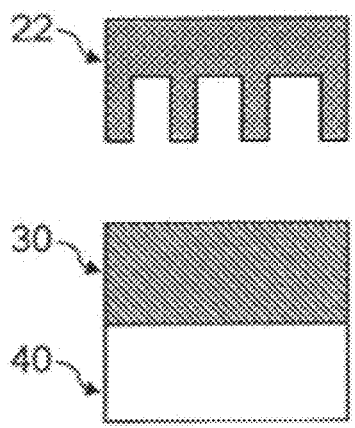 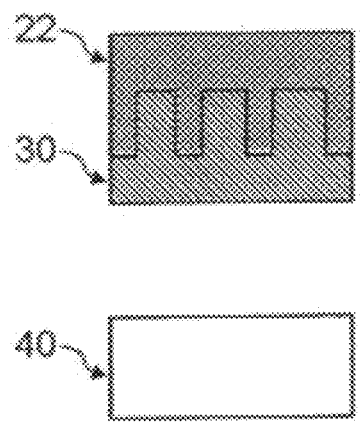
FIG. 4A  FIG. 4B
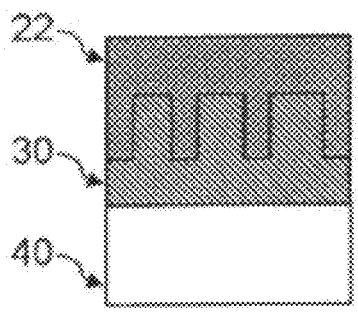 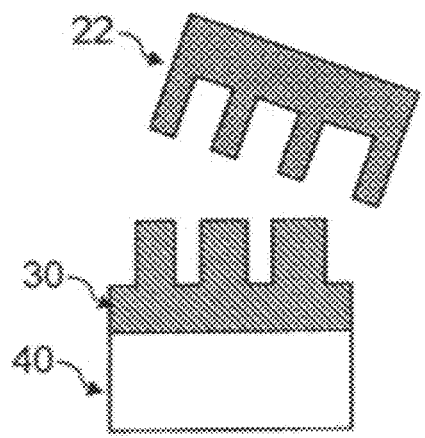
FIG. 5A  FIG. 5B

| Code | Structure | $V_f$ | Light Output (mW) | Enhanced Efficiency |
|---|---|---|---|---|
| C1 | Conventional LED | 3.11V | 7.3 | ---- |
| C2 | Planar PMMA LED | 3.13V | 7.6 | 3.8% |
| C3 | Planar PMMA+Roughness | 3.18V | 7.92 | 8.2% |
| C4 | Pyramid PMMA | 3.14V | 9.73 | 32.9% |
| C5 | Pyramid PMMA+Roughness | 3.17V | 10.07 | 37.5% |
| C6 | Inverted pyramid PMMA | 3.13V | 8.62 | 17.8% |
| C7 | Inverted pyramid PMMA+Roughness | 3.13V | 9.02 | 23.2% |
| C8 | Cylinder PMMA | 3.16V | 9.29 | 27% |
| C9 | Cylinder PMMA+Roughness | 3.17V | 9.55 | 30.6% |
| C10 | Hole PMMA | 3.12V | 8.27 | 13.1% |
| C11 | Hole PMMA+Roughness | 3.13V | 8.63 | 17.9% |

FIG. 9

MANUFACTURING METHOD OF HIGH-EFFICIENCY LED

CROSS-REFERENCES TO RELATED APPLICATIONS

This non-provisional application claims priority under 35 U.S.C. §119(a) on Patent Application No. 100104830 filed in Taiwan, R.O.C. on Feb. 14, 2011, the entire contents of which are hereby incorporated by reference.

BACKGROUND OF THE INVENTION

1. Technical Field

The disclosure relates to a manufacturing method of a light-emitting diode (LED), and in particular to a method of imprinting on a LED through a soft mold, so as to improve luminance thereof.

2. Related Art

Regarding developments of commercial LEDs, the materials adopted since 1960's, such as gallium arsenide and GaInAsP, all have lower luminance and limited emitting ranges in red, yellow, orange and green colors. In 1990's, Toshiba and HP cooperated to develop high-luminance LEDs of quaternary compounds (AlGaInP), which emit high-luminance red light and amber light and commence a new wave of high-luminance LEDs. Subsequently, Nichia developed LEDs centering on indiumnitride in conjunction with organometallic vapor phase epitaxy, which can provide green light and blue light, so that the colors provided by the LED became available at all over the full spectrum, and multiple applications became possible. Meanwhile, in conjunction with proper phosphor powder, white light can finally generated by LEDs. With the improvement of the light emitting efficiency, the application of the LED has gradually expanded to conventional light sources.

The light emitting efficiency of the current nitride LED is about 20%-30%, and requires considerable effort in comparison with the 70% light emitting efficiency of the high-luminance quaternary LED. In order to extract the light from an inner area of the LED structure, a method for damaging total reflection is generally used to improve light extraction efficiency. For example, a process of wet etching or dry etching is used to roughen a surface of the LED, so as to damage total internal reflection generated on an original smooth interface, and further improve the light extraction efficiency.

However, this method typically results in undesirable uniformity of the surface structure, causing non-uniform light emitting efficiency of the entire wafer. Meanwhile, since the etching on the semi-conductor may cause a poor electrical characteristic of the LED, and a refractive index between the semi-conductor and the air varies greatly, the light extraction efficiency is limited.

In recent years, a method is proposed to imprint a micro/nano structure on the surface of the LED and etch a periodic structure on the semiconductor or a transparent conducting film, in conjunction with an etching method, so as to improve the light emitting efficiency. Since those imprinting methods mostly adopt a hard mold (for example, materials such as silicon or aluminum oxide), and an imprinting process can only be performed on a single chip, an imprinting process for a wafer level cannot be completed due to warping of the LED substrate. To meet the requirements of commercial mass production, it is necessary to perform large-area transfer to achieve an economical result. As for a single 2-inch wafer, a standard die size can be diced into over 15,000 dies, which indicates that an imprinting process of 15,000 times is required. Under such conditions, an economical result cannot be achieved.

On the other hand, due to insufficient depth of focus in current optical lithography, pattern transfer cannot be effectively performed on a warp wafer. Consequently, the conventional lithography process cannot implement pattern manufacturing on the warp or a nonplanar surface.

Therefore, the future solution of how the imprinting process can be applied to the wafer level, is the key to commercialize the imprinting process.

SUMMARY

In view of the conventional technologies, to meet the requirements of industry interest and achieve the commercialization objectives, the disclosure is directed to a manufacturing method of a high-efficiency LED.

In an embodiment, a manufacturing method of a high-efficiency LED includes: cleaning a soft mold and an LED wafer; coating a demolding agent on the soft mold; coating an imprinting material on the soft mold; covering the soft mold on the LED wafer to perform pattern transfer; solidifying the imprinting material to form a pattern transferred from the soft mold; and demolding the soft mold from the LED wafer.

In another embodiment, a manufacturing method of a high-efficiency LED includes cleaning a soft mold and an LED wafer; coating a demolding agent on the soft mold; coating an imprinting material on the LED wafer; covering the soft mold on the imprinting material to perform pattern transfer; solidifying the imprinting material to form a pattern transferred from the soft mold; and demolding the soft mold from the LED wafer.

In another embodiment, a manufacturing method of a high-efficiency LED includes a method of forming the soft mold: cleaning a hard mold; providing a liquid mold; solidifying the liquid mold; and demolding the hard mold to form the soft mold.

In some embodiments, the cleaning step includes cleaning the soft mold and the LED wafer sequentially with acetone, isopropanol and deionized water. The demolding agent and the imprinting material are formed on the soft mold through spin-coating. The demolding agent may be polytetrafluoroethene (PTFE). The material of the soft mold may be polydimethylsiloxane (PDMS). In some cases, the imprinting material may be made of thermal plastic material, such as polymethylmethacrylate (PMMA) for thermal imprinting lithography; or, in other cases, the imprinting material may be made of any UV curable material for UV imprinting lithography. In the solidifying step of the imprinting material in different embodiments, the imprinting material may be solidified by a ultraviolet (UV) light if the imprinting material is UV curable material; or, the imprinting material may be solidified by raising the temperature above the glass transition temperature ($T_g$) and then cooling down to below the $T_g$ if the imprinting material is thermal plastic material. A pattern on the imprinting material after the transfer is a pyramid structure, or other three-dimensional structures. After the pattern transfer, the method further includes ion bombardment on a surface of the imprinting material, to improve roughness of the microstructure. The method further includes performing a die dicing and packaging process to form the LED wafer into an LED chips. The LED wafer is a (indium), gallium nitride LED.

BRIEF DESCRIPTION OF THE DRAWINGS

The disclosure will become more fully understood from the detailed description given herein below for illustration only, and thus not limitative of the disclosure, wherein:

FIG. 4A and FIG. 4B respectively illustrate differences between forward imprinting and reverse imprinting;

FIG. 5A and FIG. 5B are respectively schematic structural diagrams of processes of pattern transfer;

FIG. 9 is a comparative diagram regarding to changes of electrical characteristics and increases of light emitting efficiency improved from the conventional LED to various types of LEDs disclosed in the embodiments of the disclosure.

DETAILED DESCRIPTION

Figure 1A:
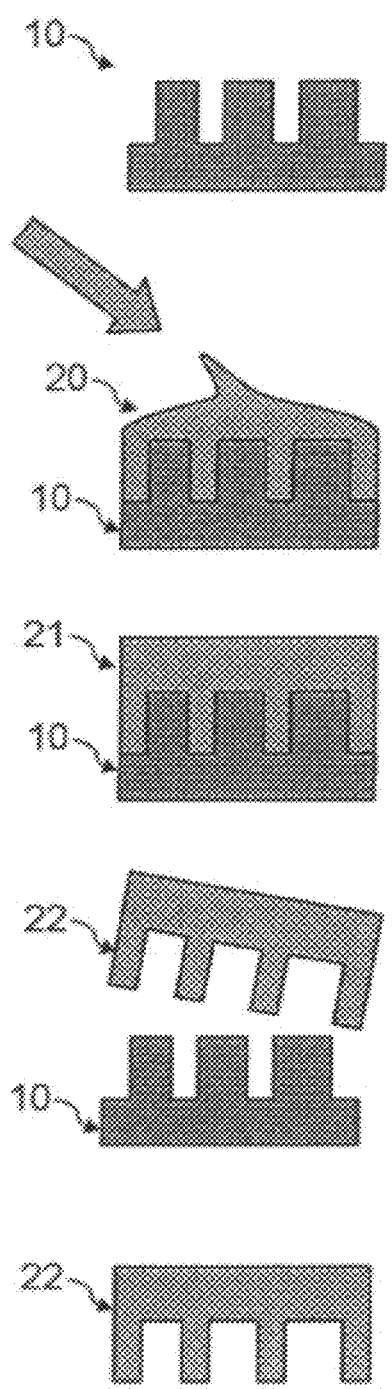
FIG. 1A and FIG. 1B are respectively a schematic structural diagram and a flow chart of steps of forming a soft mold.

The disclosure is directed to a high-efficiency LED structure and a process thereof. To fully disclose the embodiments of the disclosure, detailed steps and compositions are described in the following embodiments. Obviously, the implementation of the disclosure in the following embodiments is not limited to special details known by persons skilled in the LED field. On the other hand, the details regarding known compositions or steps are omitted, so as to provide clear explanations for each of the embodiments In addition to the detailed description, the disclosure may be also widely applied in other embodiments, and the scope of the disclosure is not limited as defined by the appended claims.

It is proved that surface structure technology can effectively improve light emitting efficiency of an LED. An embodiment of the disclosure adopts soft imprinting technology in cooperation with a reverse imprinting technology to form a micro/nano-scale structure on a camber LED wafer surface through a small pressure. In a manufacturing process, a demolding agent (or an anti-adhesion agent) is first coated on a surface of a soft mold to facilitate the subsequent demolding process; then, an imprinting material with a refractive index between the semiconductor and the air is coated on the surface of the soft mold. Afterwards, the mold is attached to the wafer with an imprinting force imposed thereon; meanwhile, the material is cured through ultraviolet (UV) or thermal process; finally, the mold is separated from the wafer (demolding) to complete the imprinting procedure.

The disclosure performs pattern transfer through the soft mold, to transfer the pattern of the soft mold to a nonplanar substrate. In technologies such as soft transfer forming or pattern transfer of the soft mold, since the transfer is performed through a contact method, the soft transfer forming is a positive choice for a nonplanar surface. A hard master mold is first manufactured, and then a soft material is used to manufacture multiple soft molds. Since the soft molds have a poor mechanical strength, it may be difficult if the pattern is imprinted onto the imprinting material through direct pressing. Therefore, a reverse imprinting process may be adopted to imprint. In the reverse imprinting, the imprinting material is first coated on the soft mold, and the structure is then transferred in a process similar to "planting". Compared to the conventional transfer forming process, such method uses only a smaller imprinting force to complete the structural transfer of the pattern. Undoubtedly this is a positive choice for both the mold and the substrate.

In the embodiment of the disclosure, it is required to first complete the manufacturing of a soft mold, in which the hard mold must be manufactured, and then the soft mold is manufactured with the desired pattern. Subsequently, an LED surface structure is formed through imprinting. Optical and electrical properties measurement is performed on the completed structure to ensure that the disclosure has a positive effect and contribution to the optical characteristic of the LED.

In the disclosure, an imprinting mold needs to be manufactured first. To manufacture the imprinting (soft) mold, a hard mold needs to be manufactured in advance. The hard mold is produced by forming a specific pattern on the surface of a silicon substrate or an aluminum oxide substrate through the optical lithography technology. An exposure apparatus, particularly, a UV(Ultraviolet) exposure apparatus is used to transfer a pattern defined on a mask onto the silicon substrate or the aluminum oxide substrate in cooperation with processes such as dry etching or wet etching. As to a nano-scale mold, a nano-scale pattern is manufactured through processes such as stepper, laser interference lithography, electron beam, ion beam lithography. The methods of dry etching or wet etching are respectively described as follows.

In the dry etching process, Hexamethyl Disilazane (HMDS) is first coated on the substrate through a spin coater and is baked through a heater. The chemical formula of HMDS is $(CH_3)_3Si—NH—Si(CH_3)_3$. HMDS is a silane chemical, and is usually used in coupling between an inorganic material and an organic material to reinforce the attachment between the wafer and photoresist, or the attachment between the glass substrate and the photoresist. The coating of HMDS on the surface has the following two functions. One is that HMDS reacts with water to produce ammonia to remove the moisture which cannot be baked out due to a chemical bond formed on a test piece/chip. The other one is that silicon atoms of HMDS produce the chemical bond on the test piece, so that an organic functional group is exposed to the outside, and HMDS produces desirable attachment to the photoresist as a surfactant between the wafer and the photoresist. Next, the photoresist is coated; for example, Shipley 1818 positive photoresist is coated on HMDS and is baked in a heater. Afterwards, a contact exposure machine such as a Karlsuss exposure machine is used to expose the pattern defined on the mask to the photoresist. Then, a development process is performed on the photoresist through a developer solution, and meanwhile the pattern on the mask is transferred to the photoresist. As to the photoresist after the development process, an optical microscope is used to observe whether the defined pattern is correct and whether uniformity of the entire line width is consistent. Afterwards, dry etching is further performed. Generally, a reactive ion etching process is used; for example, Inductively Coupled Plasma (ICP), is used for etching process. In an embodiment, ICP of STS may be used for etching process. After the photoresist is wiped off, an imprinting mold with a pattern of micrometer line width is completed.

In the wet etching process, a silicon nitride ($SiN_x$) film is first formed on the silicon substrate or the aluminum oxide substrate through a Low Pressure Chemical Vapor Deposition (LPCVD) system. Next, HMDS is coated through a spin coater and is baked through a heater. Subsequently, the photoresist is coated; for example, Shipley 1818 positive photoresist is coated on HMDS and then is baked in a heater for soft baking after coating the photoresist. A contact exposure machine such as Karlsuss contact exposure machine is used to perform an exposure process. Next, a development process is performed on the photoresist through a developer solution. As to the photoresist after the development process, it is necessary to check whether the pattern is correct and whether the uniformity of the entire line width is consistent. An optical microscope is generally used in the inspection process. Dry etching is performed afterwards. A reactive ion etching process is generally used; for example, ICP is used for etching the silicon nitride layer to complete a wet etching block layer which is also referred to as a hard mask. If the silicon substrate is used as the mold, 46% potassium hydroxide (KOH) solution may be heated in a water bath and then placed into the silicon substrate to etch the silicon substrate. If the material of the hard mold is aluminum oxide or other materials, a proper wet etching agent may be used to etch. The hard mask layer is sequentially removed, mainly using hydrofluoric acid (HF) to etch and remove the silicon nitride hard mask layer. Through this method, an imprinting mold is completed with a pattern of micrometer line width.

Figure 1B:
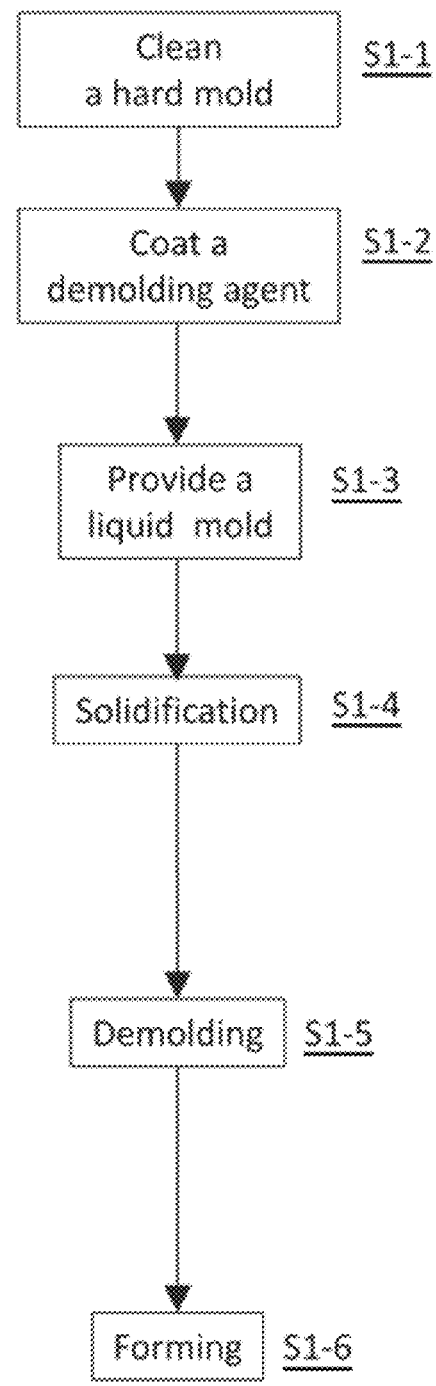

After the hard mold is formed, a soft mold is able to be further manufactured. FIG. 1A illustrates schematic structural diagrams during the process of manufacturing a soft mold; and FIG. 1B is a flow chart of manufacturing a soft mold. As hard mold 10 shown in of FIG. 1A and S1-1 of FIG. 1B, firstly the hard mold 10 is cleaned (e.g. vibrated and washed) sequentially with acetone, isopropanol and deionized water. Then, as shown in Step S1-2, a demolding agent is coated on the hard mold 10 through a spin coater; and after the completion of the coating the hard mold is placed on a heater to volatilize the solvent of the demolding agent to form a hydrophobic film. As shown in Step S1-3, a liquid mold is provided (e.g. injected, poured or sprayed) on the pattern of the hard mold 10. In an embodiment of the disclosure, the material of the soft mold may be polydimethylsiloxane (PDMS). In this step, firstly the PDMS is mixed evenly; then, the hard mold 10 is placed in a flat container, and the mixed PDMS solution 20 is poured into the container until the bubbles disappear completely. PDMS is a high-polymer organic silicon compound, and is generally referred to as organic silicon. PDMS is the most widely used organic polymer on the basis of silicon, and has a particularly unusual flow property.

As shown in Step S1-4, the hard mold 10 with the injection of liquid mold 21 is placed into an oven for baking, so as to solidify PDMS and exhaust the air existed in the liquid mold 21. After the baking process, a demolding operation is performed as shown in Step S1-5. In this step, the solidified PDMS mold 22 is separated from the hard mold 10. After demolding, as shown in Step S1-6, a soft mold 22 is formed.

Figure 2A:
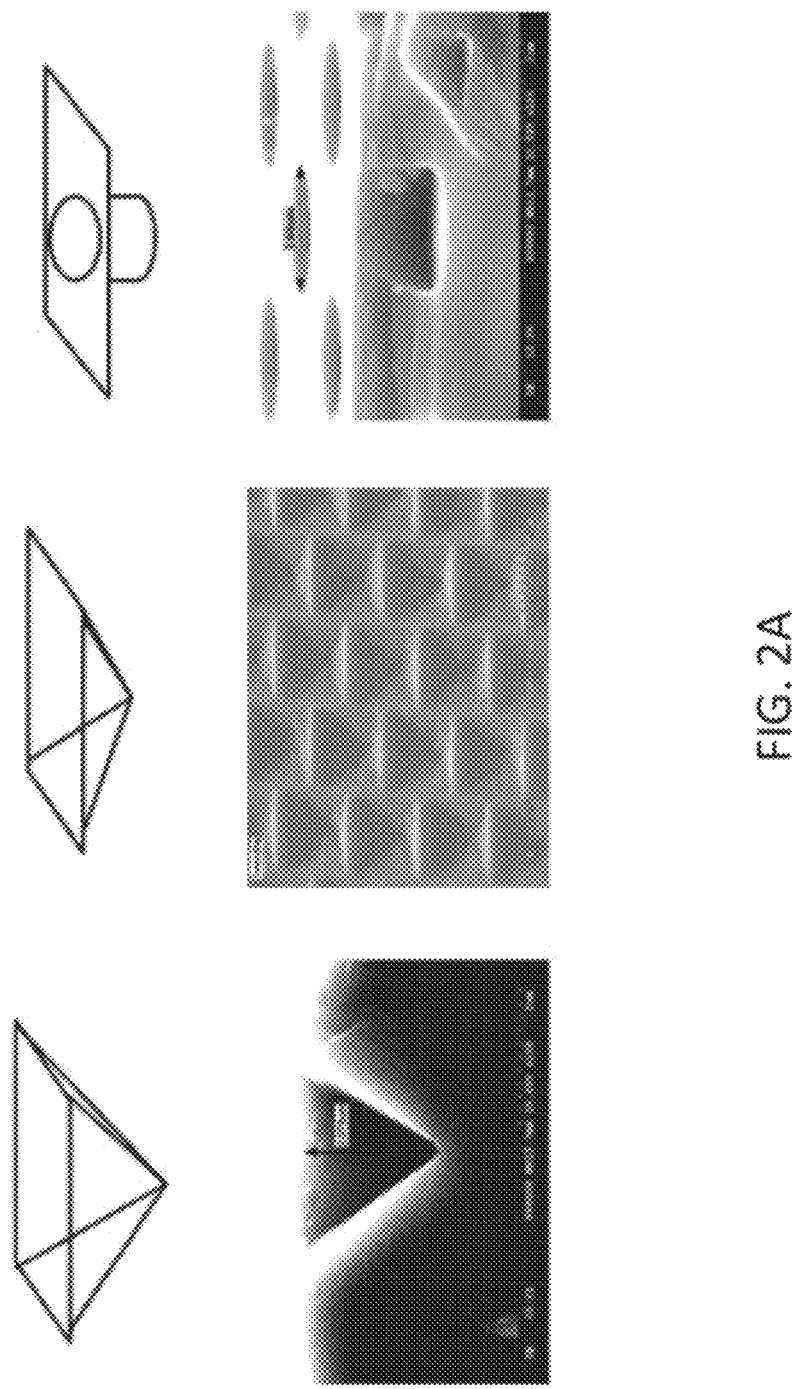
FIG. 2A and FIG. 2B are respectively a schematic diagram of surface microstructures and a scanning diagram through an electron microscope, of a hard mold and a soft mold manufactured by using silicon and PDMS.
Figure 2B:
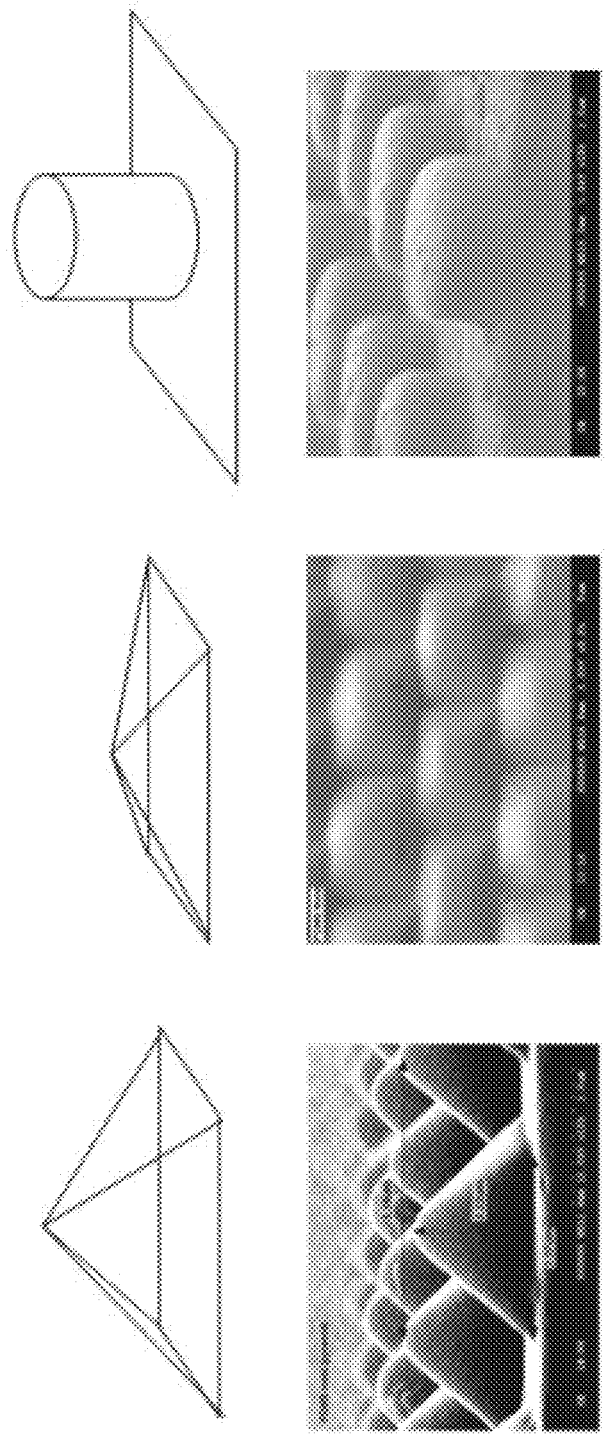

In FIG. 1A, all the patterns are illustrated by cross-sectional views; in fact, the microstructure pattern on the surface of either the hard mold 10 or the soft mold 22 may have multiple variations. In FIGS. 2A and 2B, some simple patterns are provided as examples for reference. FIG. 2A includes several views of hard molds formed through silicon molds, in which from left to right, schematic structural diagrams of deep inverted pyramids, shallow inverted pyramids and circular holes are respectively shown, and under which an electron microscope view of the silicon molds is shown respectively. The structure shown in FIG. 2A is mainly a concave pattern structure; a protruding pattern structure may be applied to another embodiment. FIG. 2B is a view of a PDMS soft mold through transferring the silicon mold in FIG. 2A. Please refer to FIG. 2B, in which from left to right, schematic structural diagrams of high pyramids, low pyramids and circular holes are respectively shown, and under which an electron microscope view of PDMS sold mold is shown respectively. Certainly in FIG. 2B, protruding structures are mainly illustrated.

Afterwards, an imprinting process is performed. Please refer to FIG. 3, as shown in Step S3-1, firstly the mold and a gallium nitride chip are cleaned sequentially with acetone, isopropanol and deionized water. As shown in Step S3-2, a demolding agent is coated on the soft mold through a spin coater. After the coating, the soft mold is placed on a heater to volatilize the agent in the demolding agent to form a hydrophobic film. In this embodiment, the demolding agent may be PTFE, which is generally called Teflon and referred to as a non-stick coating or an easy-to-clean material, and is a synthetic polymer material with fluorine replacing all hydrogen atoms in polyethylene. The PTFE material is acid-proof, alkali-resistant, and resistant from various organic solutions, and is almost insoluble in all solvents. Meanwhile, PTFE has the feature of high-temperature resistance with a low friction coefficient, so PTFE is an ideal coating material in an inner layer of a pan or a water pipe, in addition to being a lubricant.

As shown in Step S3-3, an imprinting material is coated on the soft mold or the chip through a spin coater. In an embodiment of the disclosure, the imprinting material selects PMMA, and is generally referred to as acrylic. Here the imprinting material before baking is temporarily defined as a soft material. A refractive index of the imprinting material is preferably set between the semiconductor and the air. As shown in Step S3-4, the soft mold is covered on the LED test piece/chip/wafer, and pattern transfer is further performed on the mold through an imprinting equipment. In this step, the soft mold is pressurized to transfer the pattern of the soft mold onto the imprinting material. As shown in Step S3-5 of solidification, the imprinting material is solidified to form the transferred pattern. In some cases, the imprinting material may be made of thermal plastic material, such as polymethylmethacrylate (PMMA) for thermal imprinting lithography; or, in other cases, the imprinting material may be made of any UV curable material for UV imprinting lithography. In the solidifying Step 3-4 of the imprinting material in different embodiments, the imprinting material may be solidified by a ultraviolet (UV) light if the imprinting material is UV curable material; or, the imprinting material may be solidified by raising the temperature above the glass transition temperature ($T_g$) and then cooling down to below the $T_g$ if the imprinting material is thermal plastic material, such as PMMA.

In the solidifying step of the imprinting material in different embodiments, after the imprinting process, the test piece/chip/wafer and the soft mold are taken out to perform a demolding operation and separate the test piece from the soft mold, as shown in Step S3-6. Subsequently, a gallium nitride chip imprinted with a micro/nano structure may be selectively placed into a fast furnace for baking; the baking time and temperature depend on the combinations of the imprinting material. After completion of baking process, the test piece is taken out and further cleaned.

Figure 3:
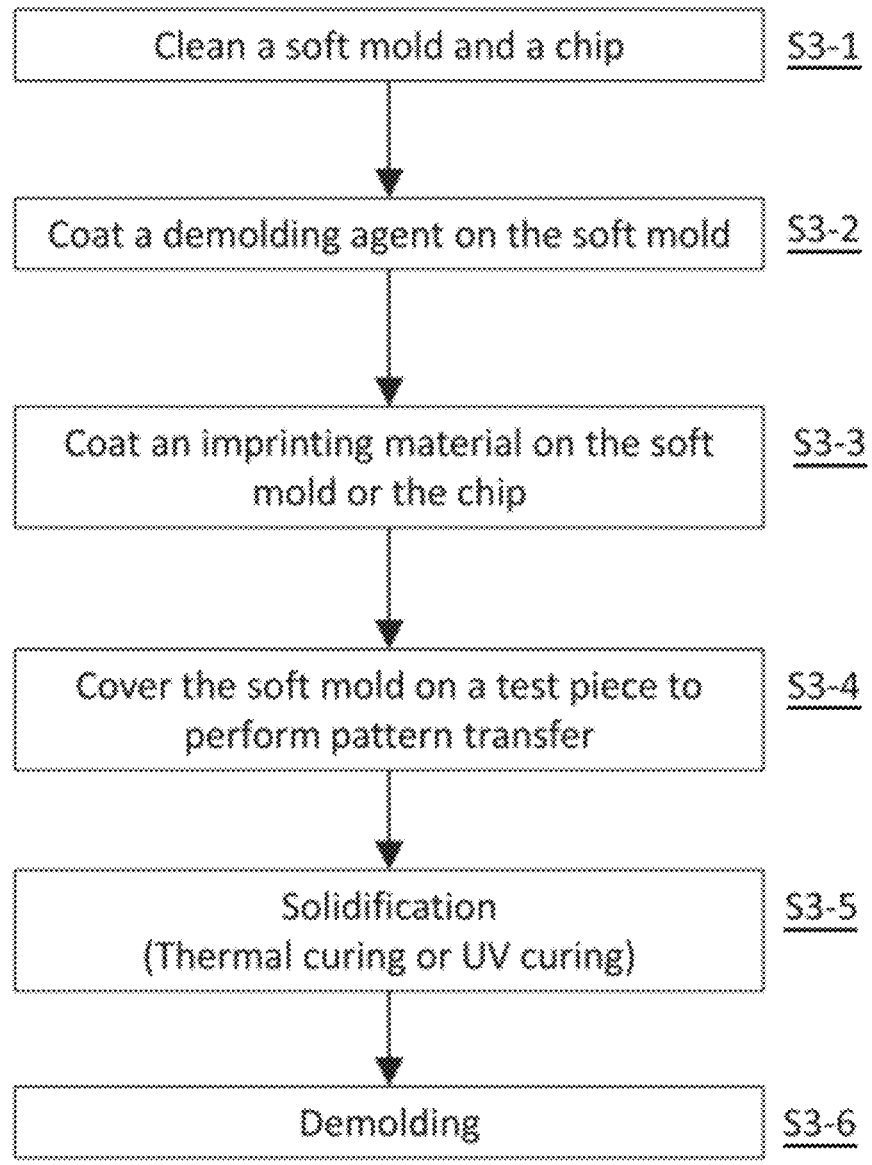
FIG. 3 is a flow chart of imprinting through a soft mold.

FIGS. 4A/4B and FIGS. 5A/5B respectively illustrate schematic structural diagrams of the soft mold and LED test piece/chip/wafer during the process shown in FIG. 3.

FIG. 4A illustrates a general forward imprinting process. An imprinting material 30 is first formed on a substrate 40, and a soft mold 22 is used to transfer a pattern to the imprinting material 30 in the following steps. In this embodiment, the imprinting material may be of PMMA and be solidified raising the temperature above the glass transition temperature ($T_g$) and then cooling down to below the $T_g$. Similar process may be applied to a UV-curable imprinting material and the solidification is performed through a UV curing process. Substrate 40 may be an LED wafer in an embodiment, produced by forming multiple gallium nitride epitaxy layers on a sapphire plate; occasionally the substrate 40 has a little bit curvature or warp. The advantage of using the soft mold 22 is that the soft mold 22 can be imprinted according to the curvature of the substrate 40.

Please refer to FIG. 4B, in which another imprinting process is a reverse imprinting process. First, the imprinting material 30 is first formed on the soft mold 22, and in this embodiment the imprinting material may be polymethylmethacrylate PMMA and be solidified raising the temperature above the glass transition temperature ($T_g$) and then cooling down to below the $T_g$. Similar process may be applied to a UV-curable imprinting material and the solidification is performed through a UV curing process. The advantage of this step lies in the fact that when desirable hydrophilicity exists between the imprinting material and the substrate, only a tiny stress is required to transfer the material in the soft mold 22 onto the substrate. Through the processes above, during the transfer of the pattern, the imprinting material 30 may be easily imprinted to form a desirable pattern. Afterwards, the imprinting material 30 is formed on the substrate 40 in a process similar to planting.

Please refer to FIG. 5A, during the imprinting process, if forward imprinting is performed, as shown in FIG. 5A, the soft mold 22 is imprinted on the imprinting material; if reverse imprinting is performed, as shown in steps in FIG. 5A, the imprinting material 30 and the soft mold 22 are planted on the substrate 40. The imprinting material 30 can be heated in either the forward imprinting or the reverse imprinting, or UV is illuminated for preliminarily solidification. The heating and pressing processes may be respectively performed on the soft mold 22 (upper surface), or respectively processed on the substrate 40 (lower surface), or processed together on the soft mold 22 and the substrate 40 (both surfaces). If an UV curing agent is added into the imprinting material, UV light may be illuminated on the imprinting material.

Please refer to FIG. 5B, in which demolding is performed. In this step, the soft mold 22 is demolded from the imprinting material 30. Since the demolding agent is used, the soft mold 22 is easily separated from the imprinting material 30. After completing the imprinting step, the microstructure surface of the imprinting material 20 may be roughened through ion bombardment technology.

Figure 6A:
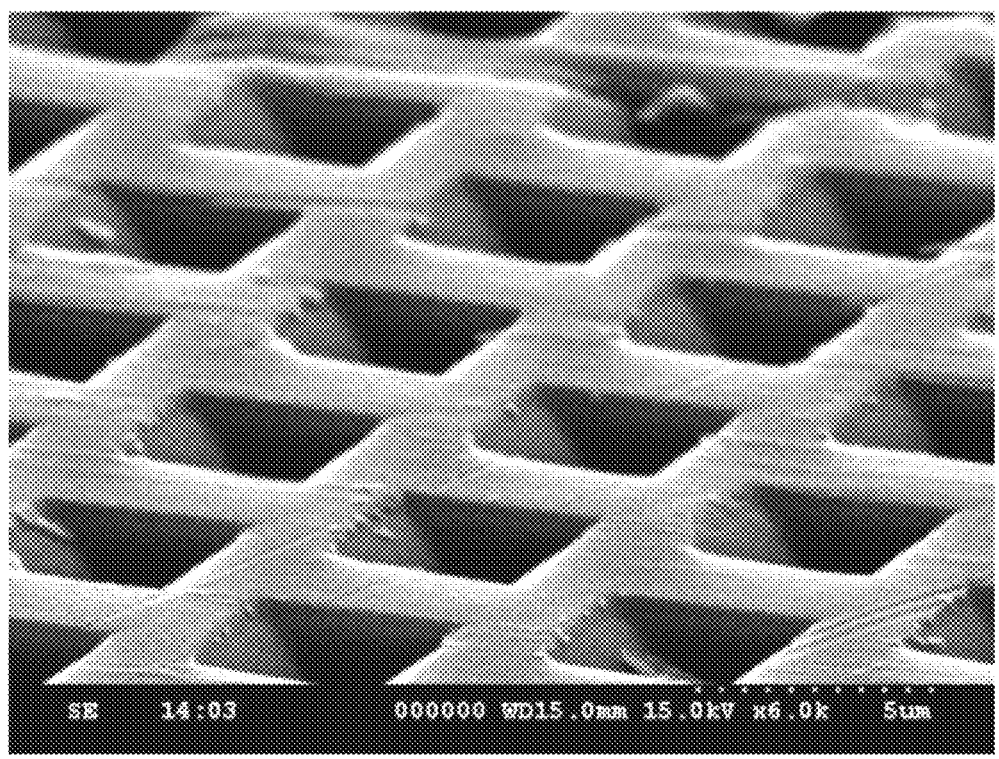
FIG. 6A, FIG. 6B and FIG. 6C respectively illustrate surface views of soft molds with deep inverted pyramids, shallow inverted pyramids and circular holes through scanning of an electron microscope.
Figure 6B:
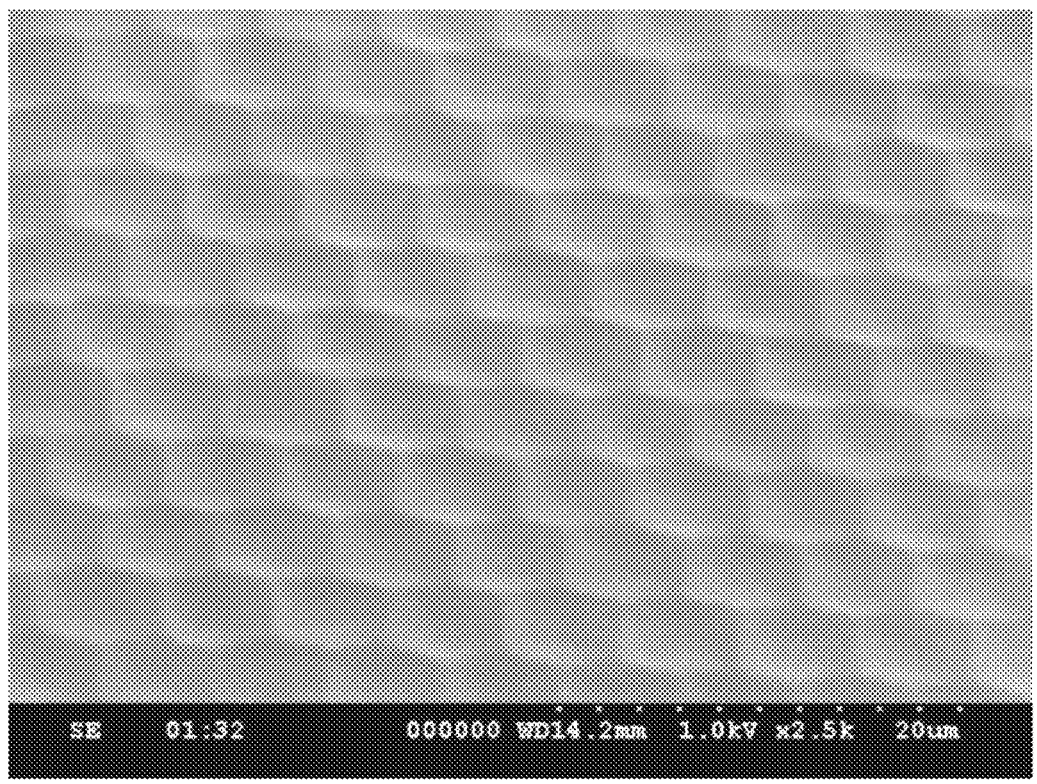
Figure 6C:
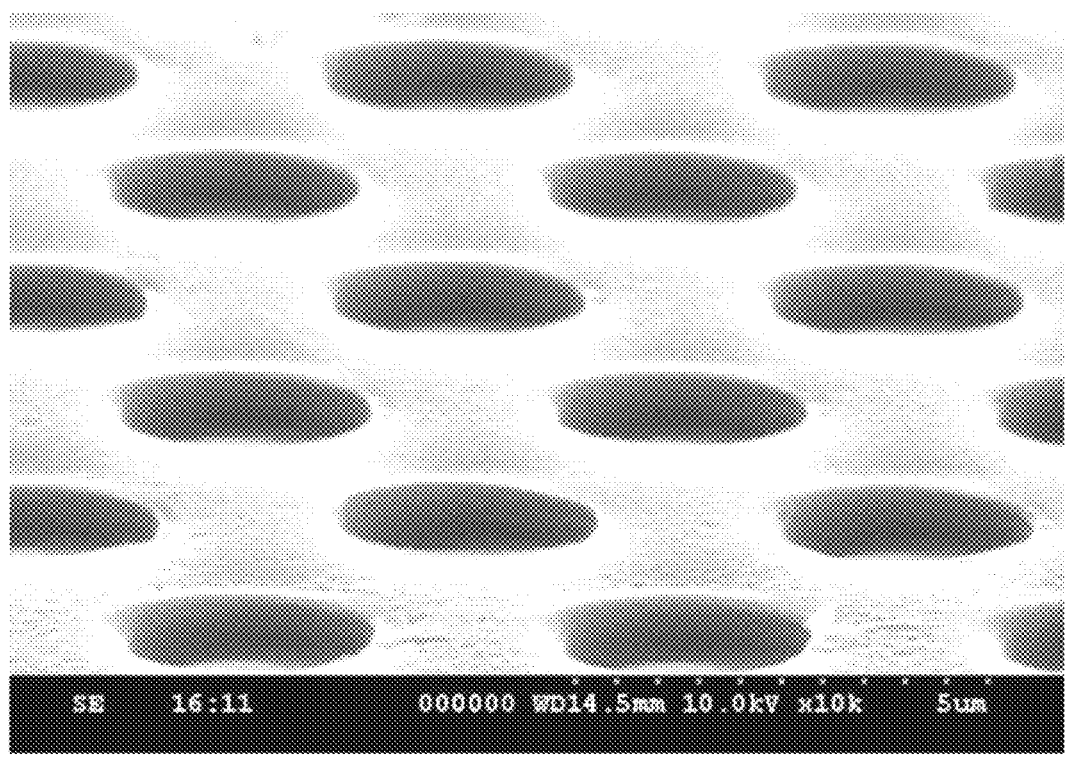

Since FIG. 4 and FIG. 5 are both schematic sectional views, please refer to FIGS. 6A/6B/6C for the microstructure surface of the imprinting material 20. After the imprinting process, various patterns may be formed on the surface of the imprinting material. In an embodiment, as shown in FIG. 6A, deep inverted pyramids may be formed on the imprinting material. As shown in FIG. 6B, shallow inverted pyramids may be formed on the imprinting material. As shown in FIG. 6C, circular holes may be formed on the imprinting material. FIGS. 6A/6B/6C illustrate; only examples of several patterns. Forward-imprinting patterns or other patterns may also be formed on the imprinting material.

Figure 7:
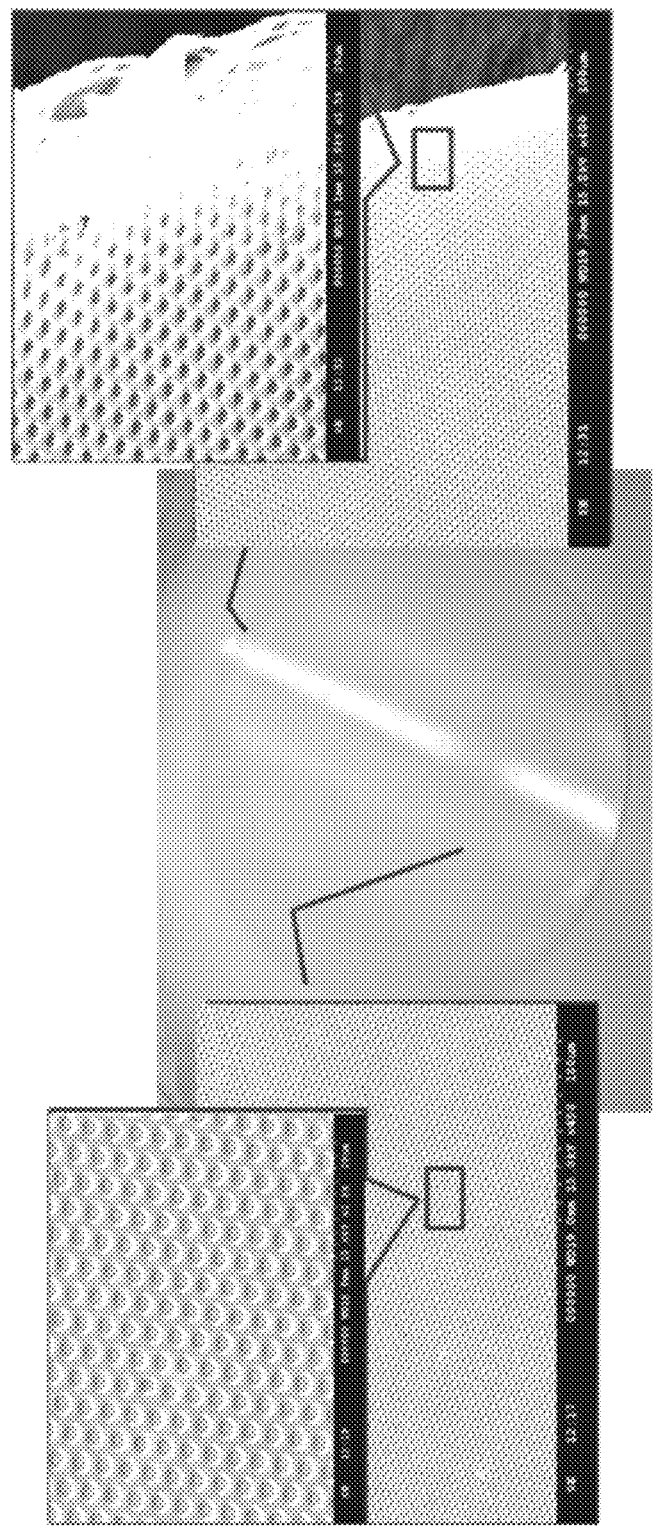
FIG. 7 is a microstructure view of a surface of a whole wafer through scanning by an electron microscope.

FIG. 7 includes an electron microscope view of an imprinting result on a 2-inch LED wafer and enlarged views at different positions thereon. At left side of the wafer, a pattern of a surface microstructure is defined close to the central position of the LED wafer; the two left patterns are shown with different magnification rates. At right side of the wafer, a pattern of a surface microstructure is defined close to an edge position; and the two patterns are shown with different magnification rates. At either the center or the periphery of the wafer, imprinting patterns are able to be evenly formed thereon.

Figure 8A:
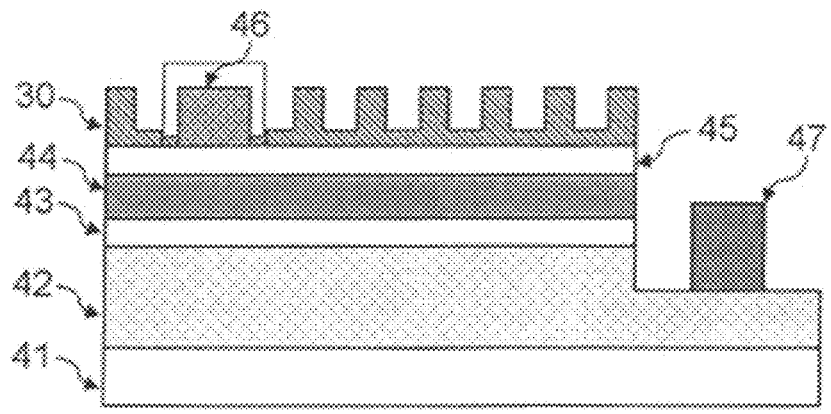
FIG. 8A is a schematic view of a conventional die according to an embodiment.
Figure 8B:
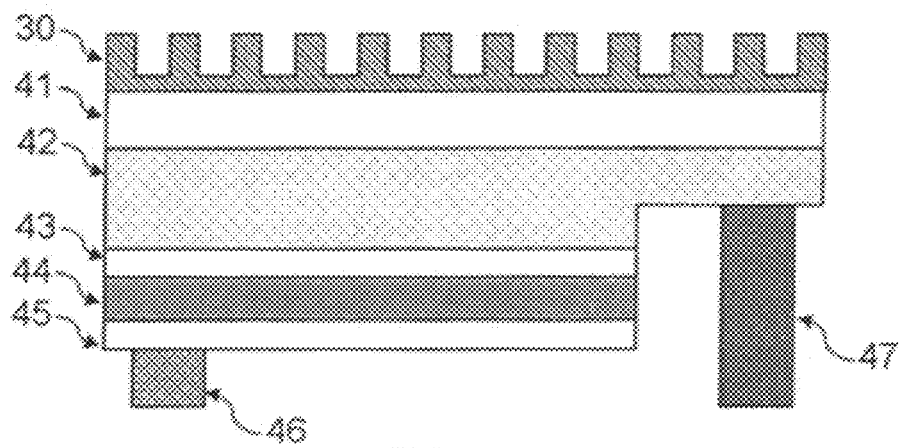
FIG. 8B is a schematic view of a flip die according to an embodiment.

FIGS. 8A and 8B are schematic structural views during die dicing process after the above imprinting process is complete. FIG. 8A illustrates a structure of a conventional LED die with two conventional electrodes upwardly disposed; a wiring bonding process is suitable for packaging such structure. FIG. 8B illustrates a structure of an LED flip die with two electrodes downward disposed; a flip chip process is suitable for packaging such structure. In each of FIG. 8A and FIG. 8B, the LED die sequentially includes a sapphire substrate 41, an N-type gallium nitride layer 42, an active layer 43, a P-type gallium nitride layer 44, a transparent conducting layer 45, a first electrode 46 connected electrically to the P-type gallium nitride layer 42, and a first electrode 47 connected electrically to the N-type gallium nitride layer 44. Since the microstructure is formed on the imprinting material, the property of the gallium nitride LED is not damaged. Consequently, the electrical characteristic of the LED is also not damaged.

Through the manufactured soft mold, the micro/nanostructure is transferred onto the surface of LEDs through an imprinting process. To determine whether the characteristic thereof is changed, measurements of an optical characteristic and an electrical characteristic respectively are made in the following. In an embodiment, an integrated sphere in cooperation with HP4216C current-voltage measurement system is used to respectively measure a current-voltage curve diagram (I-V Curve), including the electrical characteristic and light output power-current curve diagram (L-I Curve), including the optical characteristic.

Please refer to FIG. 9, in which the forward bias and light output power of LEDs with collected various surface structures are observed under 20 mA operating current:

C1 is a conventional LED, C2 is a single sprayed layer of PMMA on the LED, and C3 is same as C2 but has extra roughness treatment. C4 represents the imprinting pyramid array applied onto the conventional LED, and C5 has roughness added to the pyramids. The imprinting processes of the inverted pyramid array with and without roughness onto the conventional LEDs are labeled as C6 and C7 respectively. The imprinting processes of the cylinder array with and without roughness onto the conventional LEDs are labeled as C8 and C9 respectively. The imprinting processes of the circular hole array with and without roughness onto the conventional LEDs are labeled as C10 and C11 respectively. Although pyramid, circular hole and cylinder structure are used as major examples of the transferred pattern in the above embodiments, these structures should not be considered as general limitations to the present disclosure. Basically, any three-dimensional structures may be used to form the pattern.

The disclosure adopts a pattern transferring process to form a PMMA microstructure on the surface of the LED, which is different from the roughening process in the prior art. I-V Curve obtained through an electrical characteristic measurement is used to observe whether the electrical characteristic is affected. As the interpretations from the diagram shown in FIG. 9, forward bias values of various surface structures are all maintained within an error range of ±0.1 V, proving that the electrical characteristic is not damaged when applies the pattern transfer process of forming a microstructure and the roughening process of forming roughness to the LEDs. In FIG. 8, the surface of the LED is not affected by either the wiring bonding or the flip chip process; obviously, the electrical characteristic is barely affected.

Figure 10:
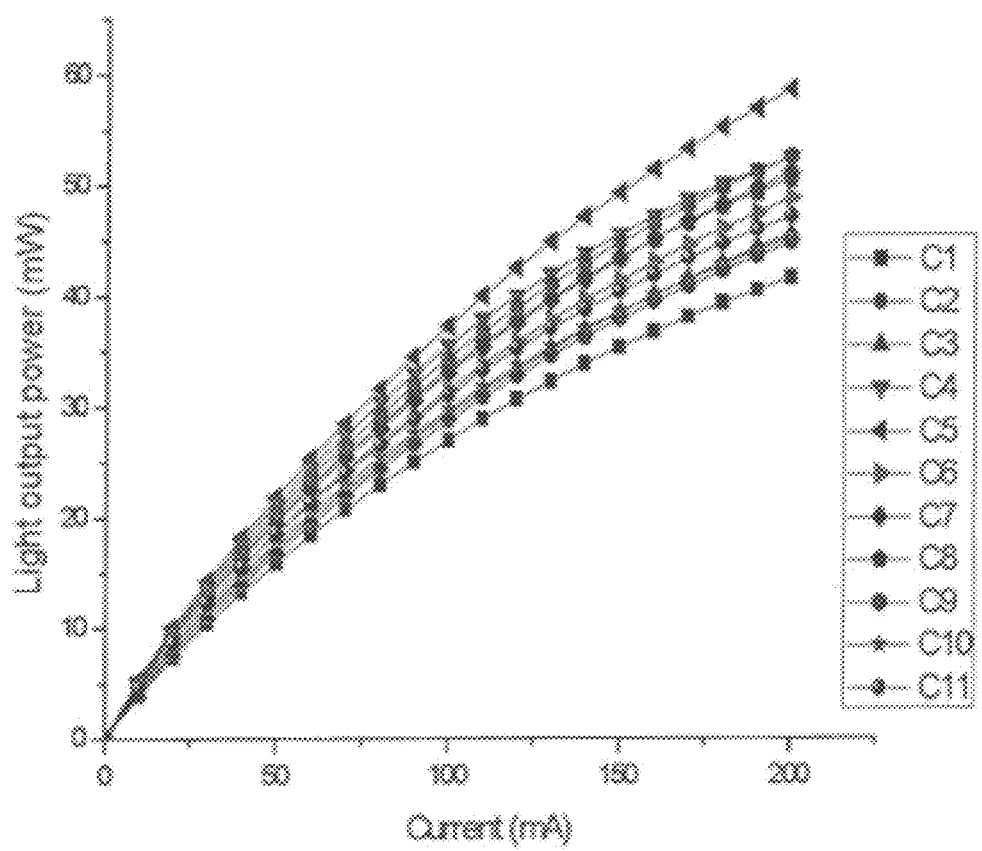
FIG. 10 is an explanatory diagram regarding to light output powers versus currents for the conventional LED and the LEDs as shown in FIG. 9.

FIG. 10 illustrates an L-I Curve of various surface types of imprinted LEDs and the conventional LED in FIG. 9. As shown in FIG. 10, the processes of forming the microstructure through a pattern transfer process and roughening the LED surfaces are able to effectively improve the light output power than the conventional LED. As the interpretations from the diagram under 20 mA operating current in FIG. 9, the planar PMMA (C2), the roughened planar PMMA (C3), the pyramid structure (C4), the roughened pyramid structure (C5), the inverted pyramid structure (C6), the roughened inverted pyramid (C7), the cylinder structure (C8), the roughened cylinder structure (C9), the circular hole structure (C 10), and the roughened circular hole structure (C11), may enhance the light emitting efficiency than the conventional LED by 3.8%, 8.2%, 32.9%, 37.5%, 17.8%, 23.2%, 27%, 30.6%, 13.1% and 17.9% respectively.

In short, through an imprinting technology, the imprinting material is imprinted on the LED with a desired pattern formed thereon. Then a roughened nano-level structure is formed through bombardment process of etching apparatus. Comparing to the influences on the electrical characteristic of various imprinted surfaces LEDs to the conventional LED, the following beneficial effects are easily obtained:

1. The disclosure develops a reverse imprinting technology and applies to the LED. With a reverse imprinting process, a PDMS mold successfully imprints desired patterns on a 2-inch full LED wafer, which fulfills the requirements of industry mass production.

2. For the various manufactured surface structures, the forward bias value of the conventional LED is respectively maintained within an error range of ±0.1 V under a 20 mA operating current, which indicates that the electrical characteristic is not damaged.

3. Ion bombardment technology is used to roughen the surface of the imprinted microstructure, and successfully improves the roughness value of the microstructure surface RMS from 2.9 nm to 25 nm, which improves the light emitting efficiency by 4%-5%.

4. The disclosed imprinting technology is able to form various imprinted surface structures onto the LED; wherein the pyramid structure enhances the efficiency to at most 32.9%.

While the disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A manufacturing method of a high-efficiency light-emitting diode (LED), comprising:

cleaning a soft mold and an LED wafer having a hydrophilic surface;

coating a demolding agent on a pattern surface of the soft mold;

coating an imprinting material on the pattern surface of the soft mold so that a first surface of the imprinting material is closer to the soft mold than any other surface of the imprinting material;

after the coating, bonding the imprinting material to the hydrophilic surface of the LED wafer with a second surface of the imprinting material disposed opposite to the first surface to perform pattern transfer, wherein a hydrophilicity exists between the imprinting material and the LED wafer;

solidifying the imprinting material to form a pattern thereupon that is transferred from the soft mold; and demolding the soft mold from the pattern transferred imprinting material so that the LED wafer remains connected with the pattern transferred imprinting material.

2. The manufacturing method according to claim 1, wherein the cleaning comprises cleaning the soft mold and the LED wafer sequentially with acetone, isopropanol and deionized water.

3. The manufacturing method according to claim 1, wherein the demolding agent and the imprinting material are coated on the soft mold through spin-coating.

4. The manufacturing method according to claim 1, wherein the demolding agent is polytetrafluoroethene (PTFE), and the soft mold is polydimethylsiloxane (PDMS).

5. The manufacturing method according to claim 1, wherein the imprinting material is thermal plastic materials or UV(ultraviolet)-curable materials.

6. The manufacturing method according to claim 1, wherein a forming method of the soft mold comprises:

cleaning a hard mold;

providing a liquid mold to the hard mold;

solidifying the liquid mold; and demolding the hard mold from the solidified liquid mold to form the soft mold.

7. The manufacturing method according to claim 6, further comprising coating a demolding agent on the hard mold before providing the liquid mold.

8. The manufacturing method according to claim 1, wherein the pattern formed on the imprinting material comprises three-dimensional structures.

9. The manufacturing method according to claim 1, wherein after the pattern is transferred to the imprinting material, the method further comprises performing ion bombardment on a surface of the imprinting material to improve roughness of the structure.

10. The manufacturing method according to claim 1, further comprising performing a die dicing and packaging process to divide the LED wafer into a plurality of LEDs.

* * * * *